(12) United States Patent
Doan

(10) Patent No.: US 7,432,119 B2
(45) Date of Patent: Oct. 7, 2008

(54) LIGHT EMITTING DIODE WITH CONDUCTING METAL SUBSTRATE

(75) Inventor: Trung Tri Doan, Los Gatos, CA (US)

(73) Assignee: Semileds Corporation, Milpitas, CA (US)

( * ) Notice: Subject to any disclaimer, the term of this patent is extended or adjusted under 35 U.S.C. 154(b) by 165 days.

(21) Appl. No.: 11/032,882

(22) Filed: Jan. 11, 2005

(65) Prior Publication Data

US 2006/0154389 A1     Jul. 13, 2006

(51) Int. Cl.
*H01L 21/20* (2006.01)
(52) U.S. Cl. .................. 438/33; 438/459; 438/113; 257/E33.066
(58) Field of Classification Search ............. 438/22–47, 438/106–127, 459, 977
See application file for complete search history.

(56) References Cited

U.S. PATENT DOCUMENTS

| | | | |
|---|---|---|---|
| 6,071,795 A | 6/2000 | Cheung et al. | |
| 6,221,683 B1 | 4/2001 | Nirschl et al. | |
| 6,448,102 B1 * | 9/2002 | Kneissl et al. | 438/46 |
| 6,555,405 B2 * | 4/2003 | Chen et al. | 438/22 |
| 6,658,041 B2 | 12/2003 | Uebbing | |
| 6,744,071 B2 | 6/2004 | Sano et al. | |
| 6,746,889 B1 * | 6/2004 | Eliashevich et al. | 438/33 |
| 6,770,542 B2 | 8/2004 | Plossl et al. | |
| 6,800,500 B2 | 10/2004 | Coman et al. | |
| 2004/0135158 A1 | 7/2004 | Hon | |
| 2004/0245543 A1 | 12/2004 | Yoo | |
| 2005/0098792 A1 | 5/2005 | Lee et al. | |
| 2005/0196888 A1 * | 9/2005 | Morita | 438/44 |
| 2006/0099730 A1 * | 5/2006 | Lee et al. | 438/46 |
| 2006/0151801 A1 * | 7/2006 | Doan et al. | 257/99 |
| 2006/0154390 A1 * | 7/2006 | Tran et al. | 438/22 |
| 2006/0154391 A1 * | 7/2006 | Tran et al. | 438/22 |
| 2006/0154393 A1 * | 7/2006 | Doan et al. | 438/26 |
| 2006/0157721 A1 * | 7/2006 | Tran et al. | 257/98 |

OTHER PUBLICATIONS

PCT Search Report dated Feb. 9, 2007.

\* cited by examiner

*Primary Examiner*—Savitri Mulpuri
(74) *Attorney, Agent, or Firm*—Patterson & Sheridan, LLP

(57) ABSTRACT

Systems and methods for fabricating a light emitting diode include forming a multilayer epitaxial structure above a carrier substrate; depositing at least one metal layer above the multilayer epitaxial structure; removing the carrier substrate.

6 Claims, 4 Drawing Sheets

Laser beam

LIGHT EMITTING DIODE WITH CONDUCTING METAL SUBSTRATE

The present invention generally relates to a light-emitting diode and a method for fabricating the same.

Light-emitting diodes (LEDs) are playing an increasingly important role in our daily life. Traditionally, LEDs are ubiquitous in many applications, such as communications and other areas, such as mobile phones, appliances and other electronic devices. Recently, the demand for nitride-based semiconductor materials e.g. having gallium nitride or GaN) for opto-electronics has increased dramatically for applications such as video displays, optical storage, lighting, medical instruments, for example. Conventional blue light-emitting diodes (LEDs) are formed using semiconductor materials of nitride, such as GaN, AlGaN, InGaN and AlInGaN. Most of the semiconductor layers of the aforementioned light-emitting devices are epitaxially formed on electrically non-conductive sapphire substrates. Since the sapphire substrate is an electrically insulator, electrodes cannot be directly formed on the sapphire substrate to drive currents through the LEDs. Rather, the electrodes directly contact a p-type semiconductor layer and an n-type semiconductor layer individually, so as to complete the fabrication of the LED devices. However such configuration of electrodes and electrically non-conductive nature of sapphire substrate represents a significant limitation for the device operation. For example, a semi-transparent contact needs to be formed on the p-layer to spread out the current from p-electrode to n-electrode. This semi-transparent contact reduces the light intensity emitted from the device due to internal reflectance and absorption. Moreover, p and n-electrodes obstruct the light and reduce the area of light emitting from the device. Additionally, the sapphire substrate is a heat insulator (or a thermal insulator) and the heat generated during the device operation can not be effectively dissipated, thus limiting the device reliability.

FIG. 1 shows one such conventional LED. As shown therein, the substrate is denoted as 1. The substrate 1 can be mostly sapphire. Over the substrate 1, a buffer layer 2 is formed to reduce the lattice mismatch between substrate 1 and GaN. The buffer layer 2 can be epitaxially grown on the substrate 1 and can be AlN, GaN, AlGaN or AlInGaN. Next, an n-GaN based layer 3, a multi-quantum well (MQW) layer 4, and a p-GaN layer 5 are formed in sequence. An etching method is employed to form an exposing region 6 on the n-GaN based layer 3. An electrical conductive semi-transparent coating is provided above the p-GaN layer 5. Finally, the n-electrode 9 and p-electrode 8 are formed on selected electrode areas. The n-electrode 9 is needed on the same side of device as p-electrode to inject electrons and holes into the MQW active layer 4, respectively. The radiative recombination of holes and electrons in the layer 4 emits light. However, limitations of this conventional LED structure include: (1) Semi-transparent contact on p-layer 5 is not 100% transparent and can block the light emitted from layer 4; (2) current spreading from n-electrode to p-electrode is not uniform due to position of electrodes; and (3) heat is accumulated during device operation since sapphire is a thermal and electrical insulator.

To increase available lighting area, vertical LEDs have been developed. As shown in FIG. 2, a typical vertical LED has a substrate 10 (typically silicon, GaAs or Ge). Over the substrate 10, a transition metal multi-layer 12, a p-GaN layer 14, an MQw layer 16 an n-GaN layer 18 are then formed. The n-electrode 20 and the p-electrode 22 are then formed on selected areas as electrodes.

U.S. patent application No. 20040135158 shows one way to realize vertical LED structure by (a) forming a buffering layer over a sapphire substrate; (b) forming a plurality of masks over said buffering layer, wherein said substrate, said buffering layer and said plurality of masks jointly form a substrate unit; (c) forming a multi-layer epitaxial structure over said plurality of masks, wherein said multi-layer epitaxial structure comprises an active layer; extracting said multi-layer epitaxial structure; (d) removing said remaining masks bonding with a bottom side of said multi-layer epitaxial structure after extracting; (e) coating a metal reflector over said bottom side of said multi-layer epitaxial structure; (f) bonding a conductive substrate to said metal reflector; and (g) disposing a p-electrode over an upper surface of said multi-layer structure and an n-electrode over a bottom side of said conductive substrate.

In one aspect, a method for fabricating a light-emitting diode includes forming a multilayer epitaxial structure above a carrier substrate; depositing at least one metal layer above the multilayer epitaxial structure; and removing the carrier substrate.

Implementations of the above aspect may include one or more of the following. The carrier substrate can be sapphire. The deposition of the metal layer does not involve bonding or gluing the metal layer to a structure on the substrate. The depositing of the metal layer can apply using electro chemical deposition, electroless chemical deposition, chemical vapor deposition (CVD), metal organic chemical vapor deposition (MOCVD), plasma enhanced chemical vapor deposition (PVD), atomic layer deposition (ALD), physical vapor deposition (PVD), plasma spray, or the combination of these techniques. The metal layer can be single or multi-layered. In case that the metal layer is a multi-layer, a plurality of metal layers with different composition can be formed, and the layers could be deposited using different techniques. In one embodiment, the thickest layer is deposited using electro or electroless chemical deposition.

In another aspect, a method for fabricating a light-emitting diode includes providing a carrier substrate; depositing a multilayer epitaxial structure; depositing one or more metal layers above the multilayer epitaxial structure; defining one or more mesas using etching; forming one or more non-conductive layers; removing a portion of the non-conductive layers; depositing at least one or more metal layers; and removing the carrier substrate.

Implementations of the above aspect may include one or more of the following. The carrier substrate can be sapphire. The deposition of the metal layer does not involve bonding or gluing the metal layer to a structure on the substrate. The depositing of the metal layer can apply using electro chemical deposition, electroless chemical deposition, chemical vapor deposition (CVD). metal organic chemical vapor deposition (MOCVD), plasma enhanced chemical vapor deposition (PECVD), atomic layer deposition (ALD), physical vapor deposition (PVD), plasma spray, or the combination of these techniques. The metal layer can be single or multi-layered. In case that the metal layer is a multi-layer, a plurality of metal layers with different composition can be formed, and the layers could be deposited using different techniques. In one embodiment, the thickest layer is deposited using electro or electroless chemical deposition.

In another aspect, a method for fabricating a light-emitting diode includes providing a carrier substrate; depositing a multilayer epitaxial structure; depositing one or more metal layers above the multilayer epitaxial structure; defining one or more mesas using etching; forming one or more non-conductive layers; removing a portion of the non-conductive layers; depositing at least one or more metal layers; and removing the carrier substrate.

Implementations of the above aspect can include one or more of the following. The metal layers could have same or different composition and deposited using various deposition techniques. The carrier substrate removal can be done using laser, etching, grinding/lapping or chemical mechanical polishing or wet etching, among others. The carrier substrate can be sapphire, silicon carbide, silicon, germanium, ZnO or gallium arsenide. The multi layer epitaxial structure can be an n-type GaN layer, one or more quantum wells with InGaN/GaN layers, and a p-type AlGaN/GaN layer. The one or more metal layers above the multi layer epitaxial structure can be indium tin oxide (ITO), Ag, Al, Cr, Ni, Au, Pt, Pd, Ti, Ta, TiN, TaN, Mo, W, a refractory metal, a metal alloy, or a composite of these materials. An optional doped semiconductor layer can be formed between the multilayer epitaxial structure and the metal layers. The mesa can be defined using a polymer (for example: resist) or a hard mask (for example: $SiO_2$, $Si_3N_4$, aluminum). The non-conductive layer can be $SiO_2$, $Si_3N_4$, a diamond element, a non-conducting metal oxide element or a ceramic element or a composite of these materials; the non-conductive layer could be a single layer or could have a plurality of non-conductive layers (for example: $SiO_2$ on $Si_3N_4$). In one implementation, the non-conductive layer is the sidewall passivation layer or passivation layer. A portion of the non-conductive layer can be removed by lifting off or dry etching to expose a conductor layer with or without using a masking layer. The conductor layer can be one or more metal layers. The one or more metal layers can be deposited using physical vapor deposition (PVD), chemical vapor deposition (CVD), plasma enhanced CVD (PECVD), evaporation, ion beam deposition, electro chemical deposition, electroless chemical deposition, plasma spray, or ink jet deposition. The metal layer can include chromium (Cr), platinum (Pt), nickel (Ni), copper, copper on a barrier metal material (for examples: titanium nitride, tungsten, tungsten nitride, tantalum nitride, molybdenum (Mo), tungsten (W) or a metal alloy. One or more of the additional metal layers can be formed by electro chemical plating or electroless chemical plating. The additional metal layer can be copper (Cu), nickel (Ni), gold (Au), aluminum (Al), or an alloy thereof. A conductive passivation (protecting the metal layer) layer can be deposited, and can be a metal, nickel (Ni), chromium (Cr), or zinc (Zn), gold, Pt, Pd. The passivation layer comprises one of: non-conductive metal oxide hafnium oxide, titanium oxide, tantalum oxide), silicon dioxide, silicon nitride or a polymer material.

In one embodiment, Ag/Pt, Ag/Pd or Ag/Cr is used as a mirror layer; Ni is used as a barrier for gold as a seed layer for electroplating. The mirror layer (Ag, Al, Pt, Ti, Cr for example) is deposited and then a barrier layer such as TiN, TaN, TiWN, TiW stuffed with oxygen is formed above the mirror layer before electro or electroless chemical deposition of a metal such as Ni, Cu or W For electrochemical deposition of copper, a seed layer is deposited using CVD, MOCVD, PVD, ALD, or evaporation process; some of the seed materials for copper are W, Au, Cu or Ni, among others.

In another method for fabricating a light-emitting diode, the process includes providing a carrier substrate; depositing a multilayer epitaxial structure; depositing one or more metal layers above the multilayer epitaxial structure; etching one or more mesas; forming one or more non-conductive layers; removing a portion of the non-conductive layers; depositing one or more metal layers; and removing the carrier substrate.

Implementations of the above method may include one or more of the following. The metal layers could have same or different composition and deposited using various deposition techniques. The carrier substrate removal can be done using laser, etching, grinding/lapping or chemical mechanical polishing or wet etching, among others. The carrier substrate can be sapphire. Depositing the metal layer can be electro chemical deposition (ECD) or electroless chemical deposition (ElessCD); before depositing the metal layer using electro chemical or electroless chemical deposition techniques, an optional step for a seed conductive layer is employed (for example, copper, nickel, tungsten seed layers deposited first using evaporation, sputtering or CVD, MOCVD before ECD of copper, nickel). Depositing the metal layer can include CVD, PECVD, PVD, evaporation, or plasma spray. Electrodes can be placed on the multilayer structure. One or more additional metal layers can be formed above the original metal layer.

In another method for fabricating a light-emitting diode, the process includes providing a carrier substrate; depositing a multilayer epitaxial structure; etching one or more mesas; forming one or more non-conductive layers; removing a portion of the non-conductive layers; depositing one or more metal layers; and removing the carrier substrate.

Implementations of the above method may include one or more of the following. The metal layers could have same or different composition and deposited using various deposition techniques. The carrier substrate removal can be done using laser, etching, grinding/lapping or chemical mechanical polishing or wet etching, among others. The carrier substrate can be sapphire. Depositing the metal layer can be electro chemical deposition (ECD) or electroless chemical deposition (ElessCD); before depositing the metal layer using electro chemical or electroless chemical deposition techniques, an optional step for a seed conductive layer is employed (for example, copper, nickel, tungsten seed layers deposited first using evaporation, sputtering or CVD, MOCVD before ECD of copper , nickel). Depositing the metal layer can include CVD, PECVD, PVD, evaporation, or plasma spray. Electrodes can be placed on the multilayer structure. One or more additional metal layers can be formed above the original metal layer to protect the underlying metal.

In a further aspect, a method for fabricating a light emitting diode includes forming a multilayer epitaxial structure above a substrate (such as a sapphire substrate), depositing a metal layer above the epitaxial layer (using electro or electroless chemical plating on top of a seed metal layer); copper or nickel plating on top of a seed layer of copper, nickel, tungsten or Pd deposited using evaporation, CVD or PVD sputtering. The seed layer is deposited on a barrier metal of TaN, TiN, TiWN, TiWOx or tungsten nitride, and the substrate is removed (using laser lift-off technique, wet etching or CMP, for example).

In one implementation, the multi-layer epitaxial structure includes a reflective metal layer coupled to the metal plating layer; a non-conductive passivation layer coupled to the reflective metal layer; a p-GaN layer coupled to the passivation layer; a multi-quantum well (MQW) layer coupled to the p-GaN layer; an n-GaN layer coupled to the MQW layer; and an n-electrode coupled to the n-GaN layer.

The metal layer can be single or multi-layered. In case that the metal layer is a multi-layer, a plurality of metal layers with different composition can be formed and the layers could be deposited using different techniques. In one embodiment, the thickest layer is deposited using electro or electroless chemical deposition.

In one embodiment, Ag/Pt, Ag/Pd or Ag/Cr is used as a mirror layer; Ni is used as a barrier for gold as a seed layer for copper plating which is used as the bulk substrate. The mirror layer (Ag, Al, Ti, Cr, Pt for example) is deposited, and then a barrier layer such as TiN, TaN, TiWN, TiW stuffed with oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

The metal layer can be single or multi-layered. In case that the metal layer is a multi-layer, a plurality of metal layers with different composition can be formed and the layers could be deposited using different techniques. In one embodiment, the thickest layer is deposited using electro or electroless chemical deposition.

In one embodiment, Ag/Pt, Ag/Pd or Ag/Cr is used as a mirror layer ; Ni is used as a barrier for gold as a seed layer for copper plating which is used as the bulk substrate. The mirror layer (Ag, Al, Ti, Cr, Pt for example) is deposited, and then a barrier layer such as TiN, TaN, TiWN, TiW stuffed with oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

In yet another aspect, a vertical LED includes a multilayer epitaxial layer formed above a temporary substrate; a metal plating layer formed above the multilayer epitaxial layer, before depositing the metal layer using electro chemical or electroless chemical deposition techniques, an optional step for a seed conductive layer is employed (for example copper, nickel, tungsten seed layers deposited first using evaporation, sputtering or CVD, MOCVD before ECD of copper, nickel), wherein the temporary substrate is removed using laser-lift-off after forming the metal plating layer.

In one embodiment, Ag/Pt, Ag/Pd or Ag/Cr is used as a mirror layer; Ni is used as a barrier for gold as a seed layer for copper plating which is used as the bulk substrate. The mirror layer (Ag, Al, Ti, Cr, Pt for example) is deposited, and then a barrier layer such as TiN, TaN, TiWN, TiW stuffed with oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

In another aspect, a vertical light emitting diode includes a metal plating layer; a reflective metal layer coupled to the metal plating layer; a passivation layer coupled to the reflective metal layer; a p-GaN layer coupled to the passivation layer; a multi-quantum well (MQW) layer coupled to the p-GaN layer; a n-GaN layer coupled to the MQW layer; an n-electrode coupled to the n-GaN layer; and a p-electrode coupled to the metal plating layer.

In one embodiment, Ag/Pt, Ag/Pd or Ag/Cr is used as a mirror layer; Ni is used as a barrier for gold as a seed layer for copper plating which is used as the bulk substrate. The mirror layer (Ag, Al, Ti, Cr, Pt for example) is deposited, and then a barrier layer such as TiN, TaN, TiWN, TiW stuffed with oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

Advantage of the invention may include one or more of the following. No wafer bonding or gluing is used and the complex and lengthy and one at a time wafer bonding/gluing process is replaced by a less complex deposition process for example physical vapor deposition (PVD), chemical vapor deposition (CVD), plasma enhanced CVD (PECVD), evaporation, ion beam deposition, electro chemical deposition, electroless chemical deposition, plasma spray, or ink jet deposition. No semi-transparent contact is needed for the n-electrode since n-GaN conductivity is good, and as a result, more light output can be emitted from the LED device. Further, since only one electrode is needed on each side of the device, the LED electrode obstructs less light. Additionally, current can spread out uniformly from n-electrode to p-electrode, thus increasing LED performance. Moreover, the metal substrate can dissipate more heat than the sapphire substrate, so more current can be used to drive the LED. The resulting LED can replace the conventional LED at a smaller size. For the same LED size, the light output from vertical LED is significantly higher than the conventional LED for the same drive current.

BRIEF DESCRIPTION OF THE DRAWINGS

To better understand the other features, technical concepts and objects of the present invention, one may clearly read the description of the following preferred embodiments and the accompanying drawings, in which.

DESCRIPTION

Figure 1:
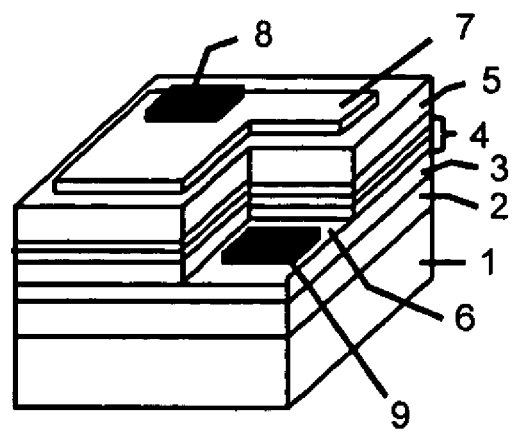
FIG. 1 shows a prior art conventional LED.
Figure 2:
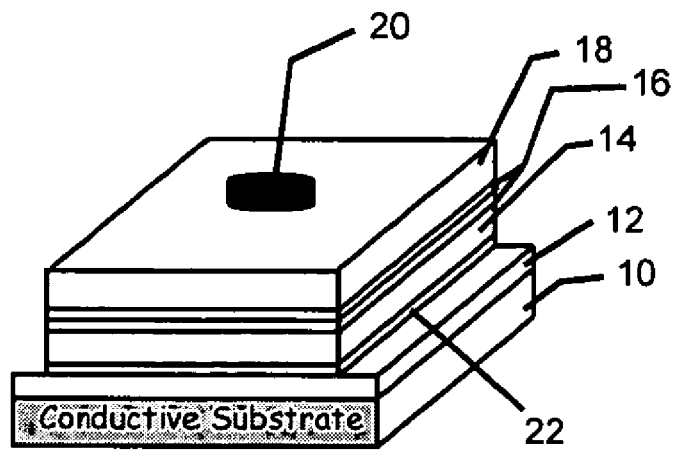
FIG. 2 shows a prior art vertical LED.

In reading the detailed description, the accompanying drawings may be referenced at the same time and considered as part of the detailed description.

Referring to FIGS. 3 to 8, a manufacturing method for vertical LEDs is illustrated therein. In the description, the reference numerals given for the inventive device structure will be also used in the recitation of the steps of the inventive manufacturing method.

The process described below is for one embodiment with InGaN LEDs initially grown on sapphire. Electro or Electroless Chemical plating is then used to deposit a thick contact for electrical and thermal conduction for the resulting LED device. Electro or Electroless Chemical plating is used in lieu of wafer bonding. The process can be applied to any optoelectronic device where bonding was used to attach the epilayer to a new host substrate for improvement of optical, electrical and thermal properties.

Figure 3:
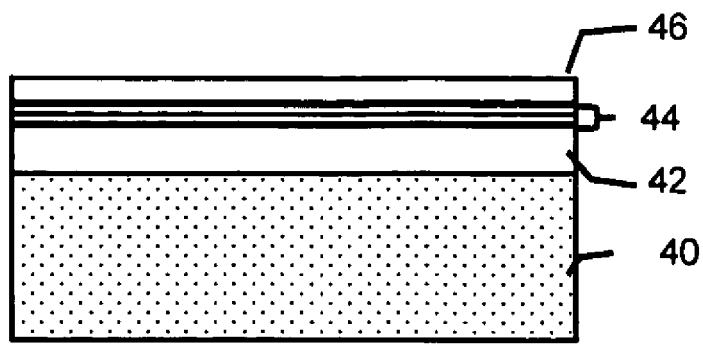
FIGS. 3-8 show operations in an exemplary process to fabricate a vertical LED.

Turning now to the diagrams, FIG. 3 shows a multi-layer epitaxial structure of an exemplary InGaN LED on a carrier 40, which can be a sapphire substrate in one embodiment. The multi-layer epitaxial structure formed above the sapphire substrate 40 includes an n-GaN based layer 42, an MQW active layer 44 and a contact layer 46. The n-GaN based layer 42 having a thickness of about 4 microns, for example.

The MQW active layer 44 can be an InGaN/GaN (or AlGaN/GaN) MQW active layer. Once an electrical current is passed between the n-GaN based layer 42 and the contact=layer 46, the MQW active layer 44 may be excited and thus generates a light. The produced light can have a wavelength between 250 nm to 600 nm. The p-layer can be a $p^+$-GaN based layer, such as a $p^+$-GaN, a $p^+$-InGaN or a $p^+$-AlInGaN layer and the thickness thereof may be between 0.01-0.5 microns.

Figure 4:
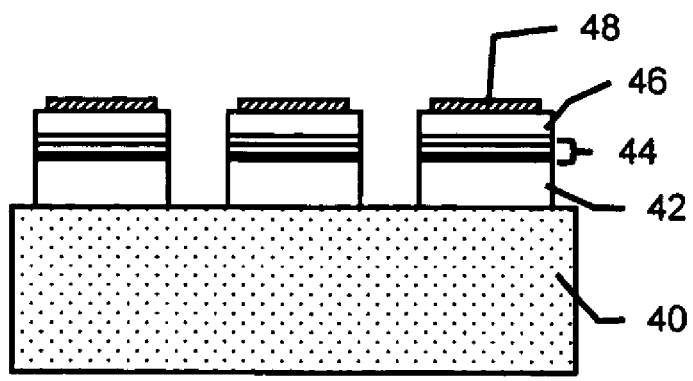

Next, as shown in FIG. 4, a mesa definition process is performed, and p-type contacts 48 are formed above the contact layer 46. The contacts 48 above the multi layer epitaxial structure can be indium tin oxide (ITO), Ag, Al, Cr, Ni, Au, Pt, Pd, Ti, Ta, TiN, TaN, Mo, W, a refractory metal, a metal alloy, or a composite of these materials (for example Ni/Au), among others. In addition, direct reflected Ag deposition as a metal contact could be also formed. In FIG. 4, individual LED devices are formed following mesa definition. Ion coupled plasma etching is used to etch GaN into separate devices.

Figure 5:
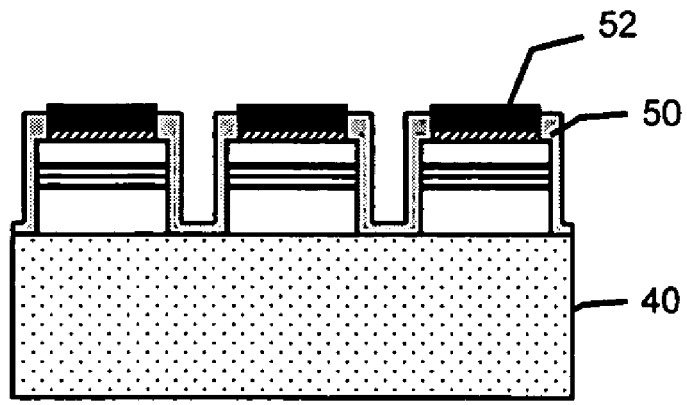

Next, as shown in FIG. 5, a passivation layer 50 is deposited and reflective metal deposition is performed to form a reflective metal 52 such as Al, Ag, Ni, Pt and Cr, among others, in a window etched into the passivation layer 50 to allow the reflective metal 52 to contact layer 46. The passivation layer 50 is non-conductive. The reflective metal 52 forms a mirror surface.

Figure 6:
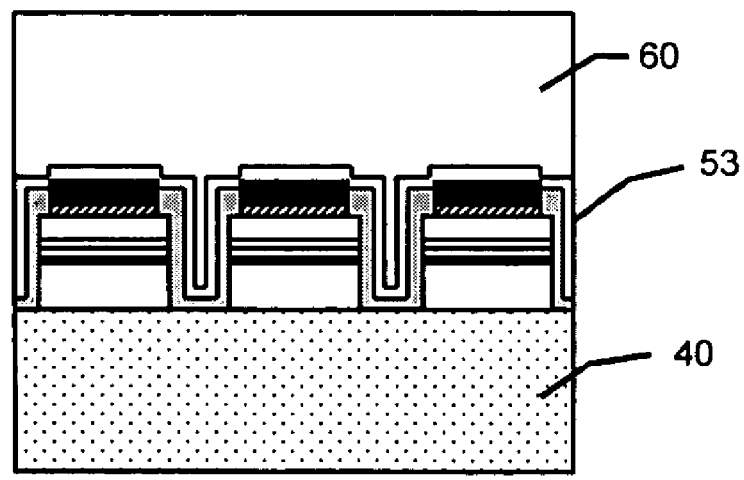

FIG. 6 shows that a thin metal layer or a multi-metal layer 53 (Cr, Pt, Pt/Au, Cr/Au, Ni/Au, Ti/Au, TaN/Au among others) is deposited over the structure to serve as a barrier/seed layer for the electro/electroless chemical plating process. However, the depositing operation is not needed if an electroless process, sputtering or magneto-sputtering process is used in lieu of electroplating. A metal substrate layer 60 is deposited thereon.

Figure 7:
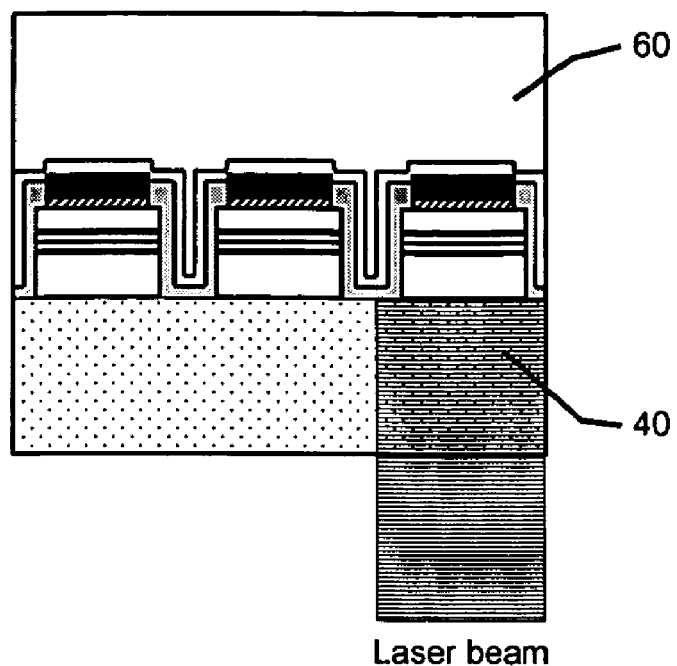

Turning now to FIG. 7, the multi-layer epitaxial structure is coated with a metal plating layer 60 using techniques such as electro and electroless chemical plating. With electroless chemical plating, the sapphire substrate 40 is protected using a polyimide layer or a coating that can be easily removed without damaging the sapphire or the electroless plated metal of a relatively thick metal such as Ni or Cu, among others.

Figure 8:
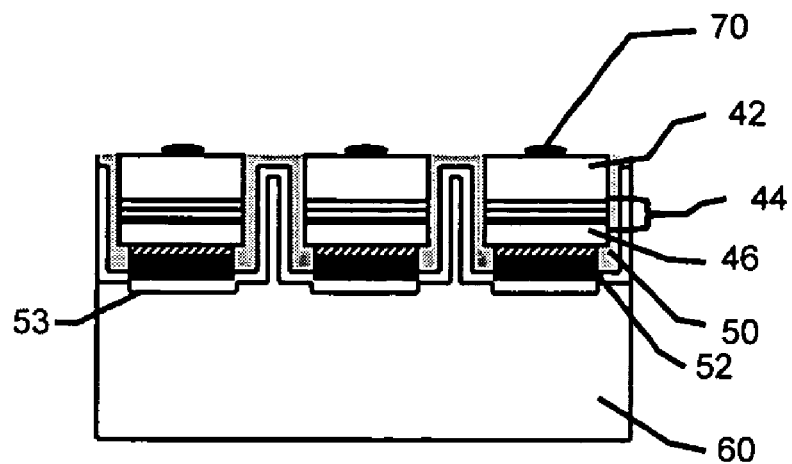

Next, the sapphire substrate 40 is removed. In one embodiment shown in FIG. 8, a laser lift-off (LLO) operation is applied to the sapphire substrate 40. Sapphire substrate removal using laser lift-off is known, reference U.S. Pat. No. 6,071,795 to Cheung et al., entitled, "Separation of Thin Films From Transparent Substrates By Selective Optical Processing," issued on Jun. 6, 2000, and Kelly et al. "Optical process for liftoff of group III-nitride films", Physica Status Solidi (a) vol. 159, 1997, pp. R3-R4). Furthermore, highly advantageous methods of fabricating GaN semiconductor layers on sapphire (or other insulating and/or hard) substrates are taught in U.S. patent application Ser. No. 10/118,317 entitled "A Method of Fabricating Vertical Devices Using a Metal Support Film" and filed on Apr. 9, 2002 by Myung Cheol Yoo, and in U.S. patent application Ser. No. 10/118,316 entitled "Method of Fabricating Vertical Structure" and filed on Apr. 9, 2002 by Lee et al. Additionally, a method of etching GaN and sapphire (and other materials) is taught in U.S. patent application Ser. No. 10/118,318 entitled "A Method to Improve Light Output of GaN-Based Light Emitting Diodes" and filed on Apr. 9, 2002 by Yeom et al., all of which are hereby incorporated by reference as if fully set forth herein. In other embodiments, the sapphire substrate is removed by wet or dry etching, or chemical mechanical polishing As shown in FIG. 8, an n-type electrode/bond pad 70 is patterned on the top of n-GaN layer 42 to complete the vertical LED. In one embodiment, bond pad 70 such as Ni/Cr (Ni is in contact with n-GaN) can be deposited using CVD, PVP or ebeam evaporation; The bond pad 70 is formed by wet or dry etch with a masking layer or using lift-off techniques with a negative masking layer (negative masking layer presents where one does not want to have the materials)

The thin metal layer or film 53 is provided as a seeding material purpose of the metal plating layer 60. The thin metal film 53 may be the same or different material with the metal plating layer 60 as long as the metal plating layer 60 may be plated on top of the film 53 using electro chemical deposition or electroless chemical deposition.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating an n-GaN up light-emitting diode (LED) wafer, comprising:
   providing a carrier substrate;
   depositing an n-GaN portion above the carrier substrate;
   depositing one or more active layers above the n-GaN portion;
   depositing a p-GaN portion above the active layers;
   depositing one or more first metal layers above the p-GaN portion;
   applying a masking layer above the first metal layers;
   etching portions of the first metal layers, the p-GaN layer, the active layers, and the n-GaN layer according to the masking layer;
   removing the masking layer;
   depositing a passivation layer above remaining portions of the first metal layers, the p-GaN layer, the active layers, and the n-GaN layer;
   removing a portion of the passivation layer to expose the remaining portions of the first metal layers;
   depositing two or more second metal layers to form a metal substrate; wherein depositing the two or more second metal layers comprises at least one of chemical vapor deposition, electrochemical deposition, electroless chemical deposition, plasma enhanced chemical vapor deposition, physical vapor deposition, atomic layer deposition, metal organic chemical vapor deposition, evaporation, ion beam deposition, sputtering and plasma spray; and
   removing the carrier substrate to expose the n-GaN portion.

2. The method of claim 1, wherein the n-GaN up LED wafer is substantially smooth and flat.

3. The method of claim 2, wherein the n-GaN up LED wafer has a surface roughness less than 10000 angstrom.

4. The method of claim 1 wherein the carrier substrate is sapphire.

5. The method of claim 1, wherein the metal substrate is a metal or metal alloy comprising at least one of copper, nickel, aluminum, Ti, Ta, Mo, and W.

6. The method of claim 1, wherein removing the carrier substrate comprises at least one of laser lift-off (LLO), wet etching, and chemical mechanical polishing (CMP).

* * * * *